United States Patent [19]

Endo et al.

[11] 4,019,198
[45] Apr. 19, 1977

[54] NON-VOLATILE SEMICONDUCTOR MEMORY DEVICE

[75] Inventors: Norio Endo; Yoshio Nishi, both of Yokohama, Japan

[73] Assignee: Tokyo Shibaura Electric Co., Ltd., Kawasaki, Japan

[22] Filed: July 3, 1974

[21] Appl. No.: 485,703

[30] Foreign Application Priority Data

July 5, 1973 Japan .............................. 48-75283

[52] U.S. Cl. .................................. 357/23; 357/52; 357/54; 340/173 R
[51] Int. Cl.² .................. H01L 29/78; H01L 29/34; G11B 13/00; G11B 9/02
[58] Field of Search .................. 357/23, 24, 54, 52; 340/173

[56]     References Cited
        UNITED STATES PATENTS

| | | | |
|---|---|---|---|
| 3,690,966 | 9/1972 | Hayashi et al. | 357/23 |
| 3,719,866 | 3/1973 | Naber et al. | 357/23 |
| 3,740,732 | 6/1973 | Frandon | 357/24 |
| 3,745,425 | 7/1973 | Beale et al. | 357/23 |
| 3,755,721 | 8/1973 | Frohman-Bentchkowsky | 357/23 |
| 3,756,876 | 9/1973 | Brown et al. | 357/23 |
| 3,781,574 | 12/1973 | White et al. | 357/24 |
| 3,800,411 | 4/1974 | Abbink et al. | 357/23 |
| 3,806,773 | 4/1974 | Watanabe | 357/23 |
| 3,868,187 | 2/1975 | Masuoka | 357/23 |
| 3,881,180 | 4/1975 | Gosney | 357/23 |
| 3,883,372 | 5/1975 | Lin | 357/59 |
| 3,909,320 | 9/1975 | Gauge et al. | 357/23 |

OTHER PUBLICATIONS

Electronics Review; vol. 41, No. 22, Oct. 28, 1968, pp. 49 and 50.

*Primary Examiner*—Andrew J. James
*Attorney, Agent, or Firm*—Cushman, Darby & Cushman

[57]     ABSTRACT

A non-volatile semiconductor memory device includes source and drain regions formed on a semiconductor substrate to define p-n junctions with the substrate and a gate layer having a silicon oxide film and a silicon nitride film. A high impurity concentration diffusion layers are formed around at least one of the source and drain regions, which have the same conductivity type as the substrate, an impurity concentration of above $10^{17}$ atoms $cm^{-3}$ and a width of below 1 $\mu$m.

7 Claims, 4 Drawing Figures

NON-VOLATILE SEMICONDUCTOR MEMORY DEVICE

This invention relates to a semiconductor device and, more particularly, to a non-votatile semiconductor memory device capable of performing a memory function by trapping electric charges between two insulating films.

As a non-votatile memory device using two insulating films there is known an MNOS (metal-silicon nitride-silicon dioxide-semiconductor) memory device in which a double-layered structure consisting of a silicon nitride film and a silicon oxide film is used as a gate insulating layer. In the MNOS memory device, stored binary information is decided by an amount of electric charges trapped at the boundary between the silicon oxide film and the silicon nitride film or in the silicon nitride film near to the boundary. However, the amount of stored charges can not be measured, as information, through direct determination. The stored information is read out by an on-off operation of the transistor using, as a reference voltage, a voltage intermediate between threshold voltages which vary with the amount of stored charges. In a p-channel transistor, for example, binary information corresponds to the following two threshold voltages:

0 . . . a low-valued threshold voltage (i.e. the absolute value of the threshold voltage is smaller than the reference voltage)

1 . . . a high-valued threshold voltage (i.e. the absolute value of the threshold voltage is greater than the reference voltage)

Note that writing 0 is referred to as a 0 writing or "erasing" and that writing 1 is referred to as a 1 writing or merely "writing".

The 1 writing is effected by applying to a gate of a transistor a voltage lower than a voltage as applied to the source and drain and substrate of the transistor i.e. a negative voltage against the source, drain and substrate and the 0 writing is effected in either of the following two methods. The first method is to apply to the gate of the transistor a positive voltage or voltage higher than a voltage as applied to the source and drain and substrate thereof, and the second method is to apply to the source and drain of the transistor a voltage lower than a voltage as applied to the gate and substrate connected in common. In the second method, an avalanche breakdown occurs at $P^+n$ junctions between the source and drain regions and the substrate, by a voltage so applied to the source and drain of the transistor, to produce hot electrons, which are injected into that portion of the gate region to effect a 0 writing called as an avalanche 0 writing. This produces the same effect as applying to the gate of the transistor a voltage higher than voltages applied to the source and drain and substrate thereof. The states 0 and 1 are held without any voltage supply from a power source and, in this sense, these information are nonvolatile in nature. A written information is read out by applying, after the 0 writing, such voltage that does not change a voltage representative of 1 into a voltage representative of 0 and vice versa.

Two types of 0 writing have been explained and now a difference therebetween will be explained by way of example.

Let us explain as a memory device an MNOS type transistor comprising an n-type silicon substrate having an impurity concentration of about $1 \times 10^{15}$ cm$^{-3}$, $p^+$-type source and drain regions formed on one side of the substrate and having an impurity concentration of about $1 \times 10^{20}$ cm$^{-3}$, a double-layered insulating gate layer formed between the source and drain regions and consisting of a silicon oxide film having a thickness of about 20 A and a silicon nitride film having a thickness of about 500 A, which is formed on said side of the substrate between the source and drain regions and a gate electrode formed of, for example, aluminium.

When a pulse voltage having a pulse width of 10 $\mu$s and a value of −35V with respect to the source and drain and substrate connected in common is applied to the gate, a threshold voltage of about −7V is obtained and 1 writing is effected. When, in this state, a +35V voltage having a pulse width of 10 $\mu$s is applied to the gate, a threshold voltage of about 30 2V is obtained. An avalanche 0 writing is effected in the following way.

When a pulse voltage having a pulse width of 10 $\mu$s and a value of −45V with respect to the gate and substrate of the 1 written transistor whose threshold voltage is about −7V is applied to the source and drain, the threshold voltage of the transistor is changed to about +2V and erasure is effected. This avalanche 0 writing is not dependent upon the pulse width of the applied voltage. Even where the pulse voltage has a pulse width of, for example, 500 ns, the 0 writing can be effected without any substantial change in threshold voltage.

In the above-mentioned memory device the 0 writing as well as the 1 writing is effected by applying a pulse voltage of unipolarity to the substrate, and even where a memory transistor and the associated circuits are integrated in the same substrate, no particular means for electrically separating the circuit elements from the substrate is required with the attendant advantage.

In spite of the above-mentioned advantage the MNOS memory has a serious disadvantage that a high 0 writing voltage is required. To obviate the disadvantage it will be necessary that the length of a channel be made as short as possible and that the source and drain regions be formed deeply, and that the thickness of silicon nitride be made smaller than that of the former example. To meet with these requirements as far as possible a transistor having a channel length of about 4 $\mu$m was formed with a silicon nitride gate film having a thickness of 200 A. When, with a threshold voltage involved in a 1 state being about −3.2V, an avalance 0 writing voltage of −25V was applied, the threshold voltage was changed to +2V and a 0 writing, i.e. erasure, was effected. It is possible in this case to make the 0 writing voltage relatively small. However, the threshold voltage (absolute value) involved in the 1 state is markedly reduced, resulting in a small difference in threshold voltage between the 1 state and the 0 state. Consequently it is very difficult to set a reading voltage.

It is accordingly the object of this invention to provide a semiconductor memory device having a structure manufacturable without requiring any high technique and capable of reducing a writing voltage without rendering appreciably small a difference in threshold voltage between a 1 state and a 0 state.

In one aspect to this invention there is provided a non-volatile semiconductor memory device comprising a semiconductor substrate of one conductivity type having an impurity concentration of below $10^{15}$ atoms per cm$^3$; source and drain regions formed in a spaced-apart relationship on one side of the semiconductor substrate to define p-n junctions with the substrate; a first insulating film formed at that portion of the semiconductor substrate situated on said one side of the semiconductor substrate and between the source and drain regions to permit incoming electric charges to be moved to its upper surface by tunnel effect; a second insulating film formed on the first insulating film to trap incoming electric charges therein; and an impurity diffusion layer formed on said one surface of the substrate to surround at least one of the source and drain regions, and having the same conductivity type as the semiconductor substrate, an impurity concentration of about $10^{17}$ atoms per cm$^3$ at the portion of the maximum impurity concentration and a width of below 1 μm.

In the semiconductor memory device according to this invention the high impurity concentration diffusion layer is formed in a width of below 1 μm, the reason of which is as follows:

When a negative voltage is applied to the source and drain regions, a depletion layer is formed mostly on the high impurity concentration layer side which is followed by an avalanche breakdown to cause high energy electrons to be injected into the gate layer on the high impurity concentration layer, thereby effecting an avalanche 0 writing. An experiment proves that the high impurity concentration diffusion layer is required to have an impurity concentration of above $10^{17}$cm$^{-3}$ and a width of below 1 μm in the injection of electrons into the gate layer under a low writing voltage.

When the impurity concentration of the substrate is made higher than $10^{15}$cm$^{-3}$, the absolute value of a threshold voltage becomes inconveniently large from the practical viewpoint. When the impurity concentration of the substrate is lower than $10^{15}$cm$^{-3}$ an avalanche writing voltage can be made lower in connection with the high impurity concentration diffusion layer having a concentration higher than $10^{17}$cm$^{-3}$.

The high impurity concentration region is so formed by a diffusion method as to have an impurity concentration of above $10^{17}$cm$^{-3}$. The high impurity concentration region has such an impurity distribution that an impurity concentration is reduced toward the interior of the substrate. For this reason, an avalanche breakdown occurs at that surface of the high impurity concentration layer which has a highest impurity concentration. Consequently, electric charges are easily trapped in the gate layer contacted with the surface of the high impurity concentration layer, thus making it possible to reduce a writing voltage.

In the prior art a high impurity concentration layer of the same conductivity tape as that of a substrate is formed, by an ion implantation method, between the source and drain regions. In this method a junction breakdown voltage of the device can be advantageously reduced. However, it is impossible to reduce a writing voltage. It is because that an avalanche breakdown takes place in the interior of the substrate due to no appreciable difference in impurity concentration between the surface of the high impurity concentration layer so formed by ion implantation method and the portion distant from the surface thereof.

This invention can be more fully understood from the following detailed description when taken in conjunction with the accompanying drawings, in which.

A non-volatile semiconductor memory device according to this invention will be explained by reference to the accompanying drawings.

Figure 1:
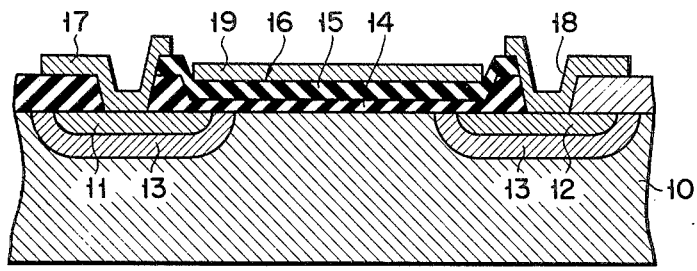
FIG. 1 is a sectional view of a semiconductor memory device according to one embodiment of this invention.

In a first embodiment shown in FIG. 1 a source and drain regions 11, 12 are provided at a predetermined interval on one side of a silicon substrate 10 having an impurity concentration of below $10^{15}$cm$^{-3}$ with a channel defined at the substrate surface between these regions 11, 12. The source and drain regions 11 and 12 are of p$^+$ conductivity type having a high impurity concentration. Two n$^+$ conductivity type diffusion layers 13 having a width of below 1 μm and an impurity concentration of above $10^{17}$cm$^{-3}$ are formed to surround the source region 11 and drain region 12 as shown in FIG. 1. Between the diffusion layer 13 and the source region and between the diffusion layer 13 and the drain region p$^+$n$^+$ junctions are defined. A first insulating film 14 is formed on the substrate surface between the source region 11 and the drain region 12. The insulating film 14 has such a thickness as to permit electrons to gain access to its surface or its neighborhood by tunnel effect during the writing operation. On the first insulating film 14 a second insulating film 15 is formed. The second insulating film 15 constitutes, together with the first insulating film 14, a gate layer 16 and the material and thickness of the gate layer 16 are so selected as to permit electrons coming to the surface of the first film 14 to be trapped. A source electrode 17, drain electrode 18 and gate electrode 19 are formed on the source region 11, drain region 12 and gate layer 16, respectively, using aluminium.

Each element of the so constructed semiconductor memory device can be formed as follows:

The semiconductor substrate 10 is a silicon substrate having an impurity concentration of $10^{14}$ atoms per cm$^3$ and a specific resistance of 200 ohms.cm; the diffusion layers 13 are formed by diffusing phosphorous in the substrate through a diffusion mask to be used in forming the source and drain regions; and then the source and drain regions 11 and 12 are formed by diffusing boron in the diffusion layers 13. When impurities, such as boron and phosphorous, having different diffusion coefficients are used, the regions 11 and 12 and diffusion layer 13 can be simultaneously formed by simultaneous diffusion. The source and drain regions 11 and 12 have a depth of about 0.6 μm and the high impurity diffusion layer 13 has a width of 0.6 μm and an impurity concentration of 3 × $10^{17}$cm$^{-3}$ at the part of the maximum impurity concentration. The maximum impurity concentration portion in the diffusion layer 13 are usually formed in near the p-n junctions according to the manufacturing manner described above. The distance between the source region 11 and the drain region 12 i.e. the length of a channel is 6.8 μm. The first insulating film 14 can be formed of silicon dioxide in a thickness of 16.5 A by thermal oxidation in the case of this embodiment and the second insulating film 15 can be formed of silicon nitride in a thickness of 400 A by reacting SiHCl$_3$ with NH$_3$ at 900° C.

The operation of the non-volatile semiconductor memory device will be explained below.

To effect an avalanche 0 writing a negative pulse voltage is first applied to the source and drain with respect to the silicon substrate 10 and gate electrode 19. The pulse voltage has a value necessary to cause an avalanche breakdown to occur between the silicon substrate 10 and the source region 11 and between the silicon substrate 10 and the drain region 12. For example, a pulse voltage having a value of −35V and a pulse width of 10 μs can be applied. When the negative pulse voltage is so applied to the source and drain with respect to silicon substrate 10 and the gate electrode 19, an avalanche breakdown is caused to produce carriers (electrons and holes having high energies) mostly in the high impurity concentration layer 13. Since a positive potential is applied to the gate electrode 19 and the silicon dioxide film 14 has a width smaller than a distance acted on by tunnel effect, electrons of the carriers are moved through the first insulating film 14 into the gate layer 16 and trapped at the junction, or its neighborhood, between the first insulating film 14 and the second insulating film 15, thereby completing the 0 writing. The trapped electrons can not be moved, in a horizontal direction, in the gate layer due to the insulating property of the films 14 and 15 and are distributed only above the high impurity concentration layer 13. A threshold voltage involved at this time is 2V.

Explanation will be made with reference to a 1 writing.

With the source and drain regions 11 and 12 and silicon substrate 10 connected in common, a pulse voltage, for example, having a value of −30V with respect to these regions and silicon substrate and a pulse width of 5 μs is applied to the gate 19 to cause the electrons trapped in the gate layer 16 during the 0 writing period to be moved through the silicon dioxide layer 14 into the silicon substrate 10, thereby completing the 1 writing. A threshold voltage involved at this time is −6V.

During a reading operation 0 or 1 is determined dependent upon whether or not a source-drain current flows.

Figure 2:
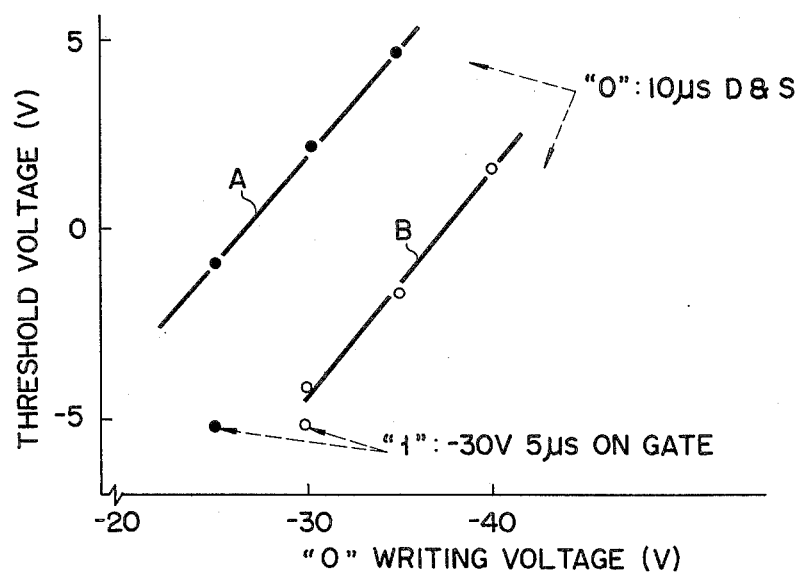
FIG. 2 is a graphical representation showing a comparison in electrical characteristics between the present device and a prior art device.

FIG. 2 shows a comparison in characteristics between the non-volatile semiconductor memory device described above and a conventional MNOS memory device having no high impurity diffusion layer. The conventional memory device used for comparison is similar to the memory device of this invention except that a first insulating film has a thickness of 505 A and that a second insulating film has a thickness of 16.8 A.

In a graphical representation of FIG. 2 the threshold voltage (V) is plotted as ordinate and the writing voltage (V) is plotted as abscissa. The characteristic of the memory device according to this invention is indicated by lines A and black dots, while the characteristic of the conventional memory device is indicated by lines B and white dots. As will be understood from this graph the 0 writing voltage can be made about 10V lower than those obtained from the conventional memory device.

With the above-mentioned memory device the two high impurity concentration diffusion layers are formed to surround the source region and drain region. However, the diffusion layer may be formed to surround only one of the source and drain regions. This example will be explained below by reference to FIG. 3.

Figure 3:
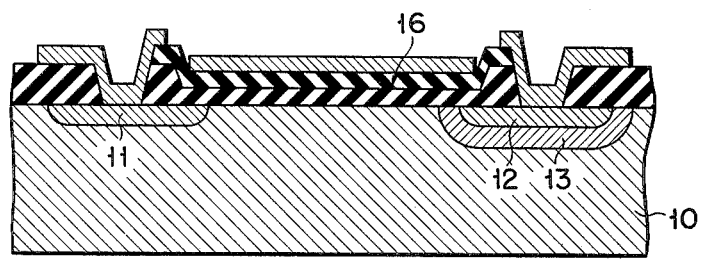
FIGS. 3 and 4 are cross-sectional views each showing another embodiment according to this invention.

With an embodiment of FIG. 3 a high impurity concentration layer 13 having a width of 0.6 μm and an impurity concentration of $10^{18}$cm$^{-3}$ is formed on one side of a silicon substrate 10. However, no high impurity concentration layer is formed around a source region 11 as in the case of a conventional art. The other arrangement is substantially similar to that of the semiconductor memory device shown in FIG. 1.

With the semiconductor memory device shown in FIG. 3, electrons are trapped only in that portion of a gate layer 16 which is situated above the portion of the high impurity concentration layer 13, and a difference between threshold voltages involved is made smaller than the memory device havin two high impurity concentration layers, but a 0 writing can be effected by applying a negative voltage only to a drain region.

Figure 4:
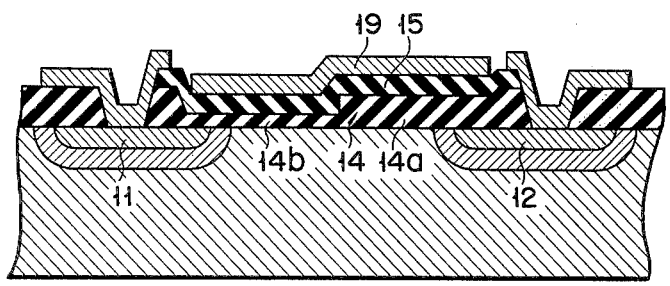

According to this invention the first and second insulating films constituting the gate layer are not necessarily required to have a uniform thickness and, for example, they are formed as shown in FIG. 4.

In a semiconductor memory device shown in FIG. 4 a first insulating film 14 has a thick portion 14a and a thin portion 14b and a boundary between the thick and thin portions which is situated substantially at the center of a channel formed between source and drain regions 11 and 12. The thick portion 14a is formed in a thickness of about 1000 A on the side of the drain region, while the thin portion 4b is formed in a thickness of about 16.5 A on the side of the source region. The silicon dioxide film 14 has, therefore, a stepped portion. Likewise, a silicon nitride film 15 and gate electrode 19, each, have a stepped portion, though uniform in thickness.

With the semiconductor memory device shown in FIG. 4, a 0 writing are effected in the same manner as the embodiment shown in FIG. 1. A threshold voltage involved in the 0 state is determined by the thick portion 14a of the first insulating film 14 and it becomes about −2V if use is made of a substrate having an impurity concentration of about $10^{15}$cm$^{-3}$. Since the threshold voltage is not varied even by the 1 writing and 0 writing, during an avalanche 0 writing time a negative voltage pulse may be applied only to that region (the source region 11 in this case) placed adjacent to the thin portion of the silicon oxide film.

In the semiconductor memory device according to this invention, source and drain regions and high impurity concentration region can be formed after the formation of a gate layer and gate electrode. In this case, the gate electrode can be formed using a polycrystal silicon or high melting metal such as molybdenum, tungsten etc., in place of aluminium. The gate electrode can be advantageously used as a mask through which an impurity can be diffused to form source and drain regions and a high impurity concentration diffusion layer. Where an impurity is so diffused after the formation of the gate electrode, the area of those portions overlapped between the source region and gate region and between the drain region and the gate region can be made smaller, thus obtaining a small-sized semiconductor device as a whole.

The above-mentioned semiconductor memory device according to this invention is not restricted only to a p-channel type and it will easily occur to those skilled in the art that it can be applied also to an n-channel type. An alumina film or a tantalum oxide-alumina blended film may be used in place of the silicon nitride film, if it can trap electrons.

What we claim is:

1. A non-volatile semiconductor memory device comprising a semiconductor substrate of one conductivity type having an impurity concentration of below $10^{15}$ atoms per cm$^3$; source and drain regions formed in a spaced-apart relationship on one side of the semiconductor substrate to define p-n junctions with the substrate; a gate having first and second insulating films;

said first insulating film being formed at that portion of the semiconductor substrate situated on said one side of the semiconductor substrate and between the source and drain regions and having a thickness to permit incoming electric charges to be moved to its upper surface; said second insulating film being formed on the first insulating film to trap incoming electric charges therein; and an impurity diffusion layer formed to surround at least one of the junctions defined by the source and drain regions with the substrate, and having the same conductivity type as the semiconductor substrate, an impurity concentration above $10^{17}$ atoms per cm$^3$ at the portion of the maximum impurity concentration and a width of below 1 $\mu$m.

2. A non-volatile semiconductor memory device according to claim 1, in which said first insulating film is a silicon dioxide film having a thickness of not greater than 16.5A so as to permit the electrons to be passed therethrough by tunnel effect.

3. A non-volatile semiconductor memory device according to claim 2, in which said second insulating film is a silicon nitride film.

4. A non-volatile semiconductor memory device according to claim 2, in which said impurity diffusion layer is formed to surround the junctions defined by the source and drain regions with the substrate.

5. A non-volatile semiconductor memory device according to claim 2, in which said silicon dioxide film has a substantially uniform thickness.

6. A non-volatile semiconductor memory device according to claim 2, in which said silicon dioxide film has a first portion and a second portion thicker than the first portion, the boundary of which is situated substantially intermediate between the source and drain regions.

7. A non-volatile semiconductor memory device according to claim 1 which further includes means for applying a writing voltage to the gate and an erasing voltage having the same polarity as the writing voltage to the source and drain regions.

* * * * *